US008218121B2

(12) United States Patent
Lee et al.

(10) Patent No.: US 8,218,121 B2
(45) Date of Patent: Jul. 10, 2012

(54) LIQUID CRYSTAL DISPLAY HAVING A PRINTED CIRCUIT BOARD COMBINED WITH ONLY ONE OF THE TAPE CARRIER PACKAGES

(75) Inventors: Joo Hong Lee, Gyeongsangbuk-do (KR); Jae Hyun Park, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 916 days.

(21) Appl. No.: 11/448,825

(22) Filed: Jun. 8, 2006

(65) Prior Publication Data

US 2007/0076159 A1    Apr. 5, 2007

(30) Foreign Application Priority Data

Sep. 30, 2005   (KR) .......................... 10-2005-0092346

(51) Int. Cl.
*G02F 1/1345*   (2006.01)
(52) U.S. Cl. ......... 349/149; 249/150; 249/151; 249/152
(58) Field of Classification Search ........... 349/149–152
See application file for complete search history.

(56) References Cited

U.S. PATENT DOCUMENTS

2001/0026345 A1 * 10/2001 Park et al. .................... 349/149
2002/0018169 A1    2/2002 Kato
2002/0109658 A1    8/2002 Noguchi
2002/0180686 A1 * 12/2002 Yuda et al. .................... 345/103
2004/0012745 A1    1/2004 Ito
2004/0125096 A1    7/2004 Park et al.
2004/0169645 A1 *  9/2004 Sakaki ........................ 345/204
2005/0083475 A1    4/2005 Hsu

FOREIGN PATENT DOCUMENTS

| JP | 6-231814 | | 8/1994 |
| JP | 06231814 A | * | 8/1994 |
| JP | 2003-186044 | | 7/2003 |
| JP | 2005-043489 | | 2/2005 |
| KR | 2004-0033368 | | 4/2004 |

* cited by examiner

*Primary Examiner* — Jessica M Merlin
(74) *Attorney, Agent, or Firm* — McKenna Long & Aldridge LLP (57) ABSTRACT

The present invention relates to a liquid crystal device to which a line on glass structure and a cascade structure are both applied, and a manufacturing method thereof. The liquid crystal device includes: a liquid crystal panel including a plurality of pixels defined by gate lines and data lines that cross each other, wherein a first group of signal lines is formed on the liquid crystal panel in an on-glass-configuration; a plurality of tape carrier packages mounted with source drivers that provide data signals through the data lines to the liquid crystal panel and mounted on the liquid crystal panel in a cascade structure, wherein a second group of signal lines connected to the first group of signal lines is formed thereon; and a printed circuit board combined directly with only one of the plurality of tape carrier packages so as to supply a plurality of driving signals and control signals to the liquid crystal panel.

4 Claims, 6 Drawing Sheets

LIQUID CRYSTAL DISPLAY HAVING A PRINTED CIRCUIT BOARD COMBINED WITH ONLY ONE OF THE TAPE CARRIER PACKAGES

This application claims the benefit of Korean Patent Application No. 2005-0092346, filed on Sep. 30, 2005, which is incorporated by reference for all purposes as if fully set forth herein.

BACKGROUND OF THE INVENTION

1. Field of the Invention

The present invention relates to a liquid crystal display and a manufacturing method thereof.

2. Discussion of the Related Art

A liquid crystal display is capable of displaying desired images by adjusting the intensity of an electric field created in a liquid crystal material having an anisotropic dielectric constant and injected between upper and lower transparent insulating substrates. The electric field changes the molecular arrangement of the liquid crystal material and thereby adjusts the amount of light passing through the transparent insulating substrates. A thin film transistor substrate (TFT LCD) employing thin film transistors (TFTs) as switching elements is used in the liquid crystal display.

The liquid crystal display includes a liquid crystal panel having a plurality of pixels defined by gate lines and data lines to display images and a driving circuit unit for driving the liquid crystal panel.

The driving circuit unit includes gate drivers and source drivers for driving the gate lines and data lines, respectively, of the liquid crystal panel, a timing controller for controlling driving timing of the gate drivers and source drivers, and a power source for supplying driving voltages needed to drive the liquid crystal panel and driving circuit unit.

The gate drivers and source drivers may be implemented in a number of integrated circuits (ICs). The ICs may be mounted using a tape carrier package (TCP), a chip-on-film (COF) structure where it is mounted on a base film of the tape carrier package and then is coupled electrically to the liquid crystal in a TAP (tape automated bonding) method, a chip-on-glass (COG) structure where it is mounted directly on the liquid crystal, and the like.

Figure 1:
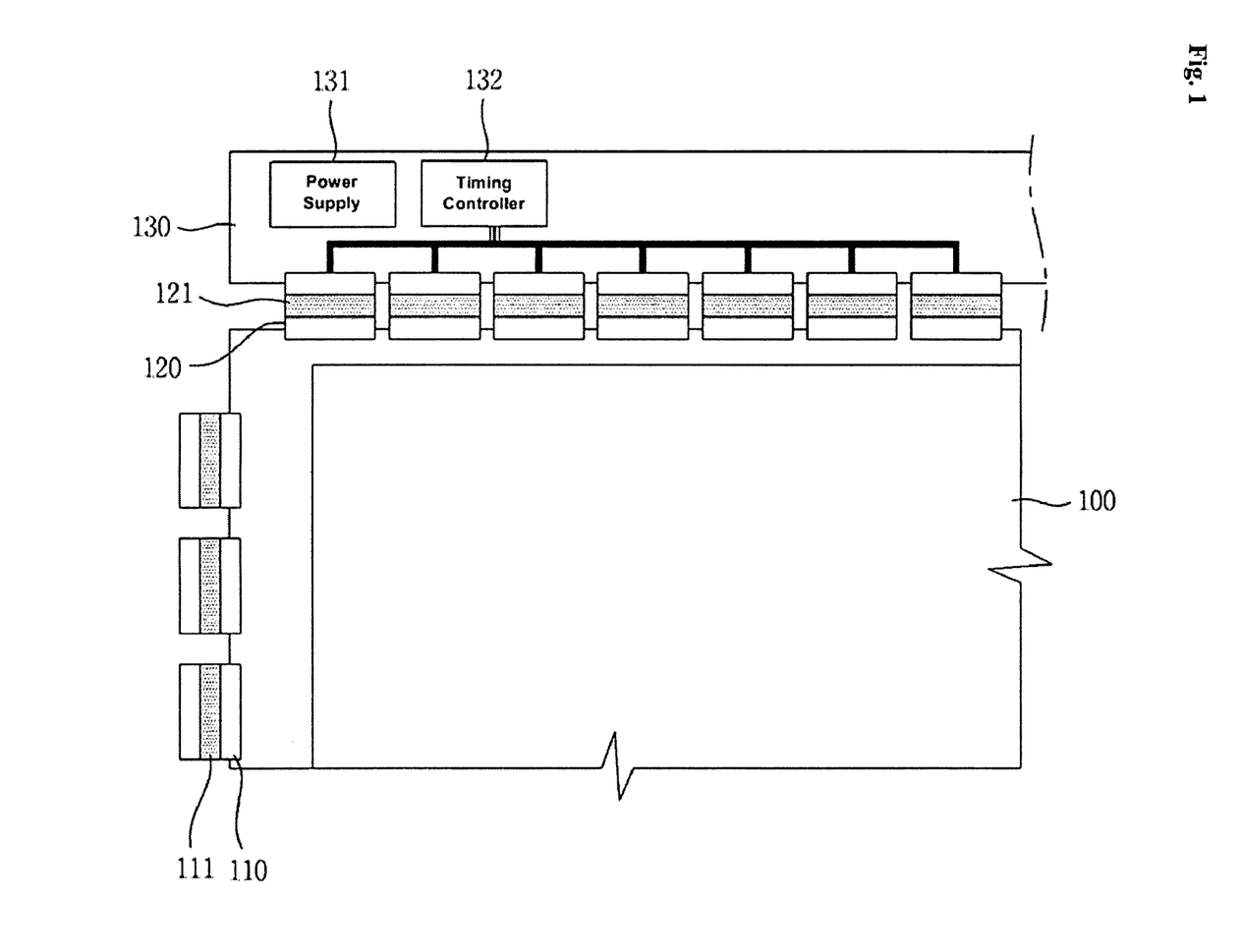
FIGS. 1 and 2 are schematic views of a liquid crystal display according to the prior art.
Figure 2:
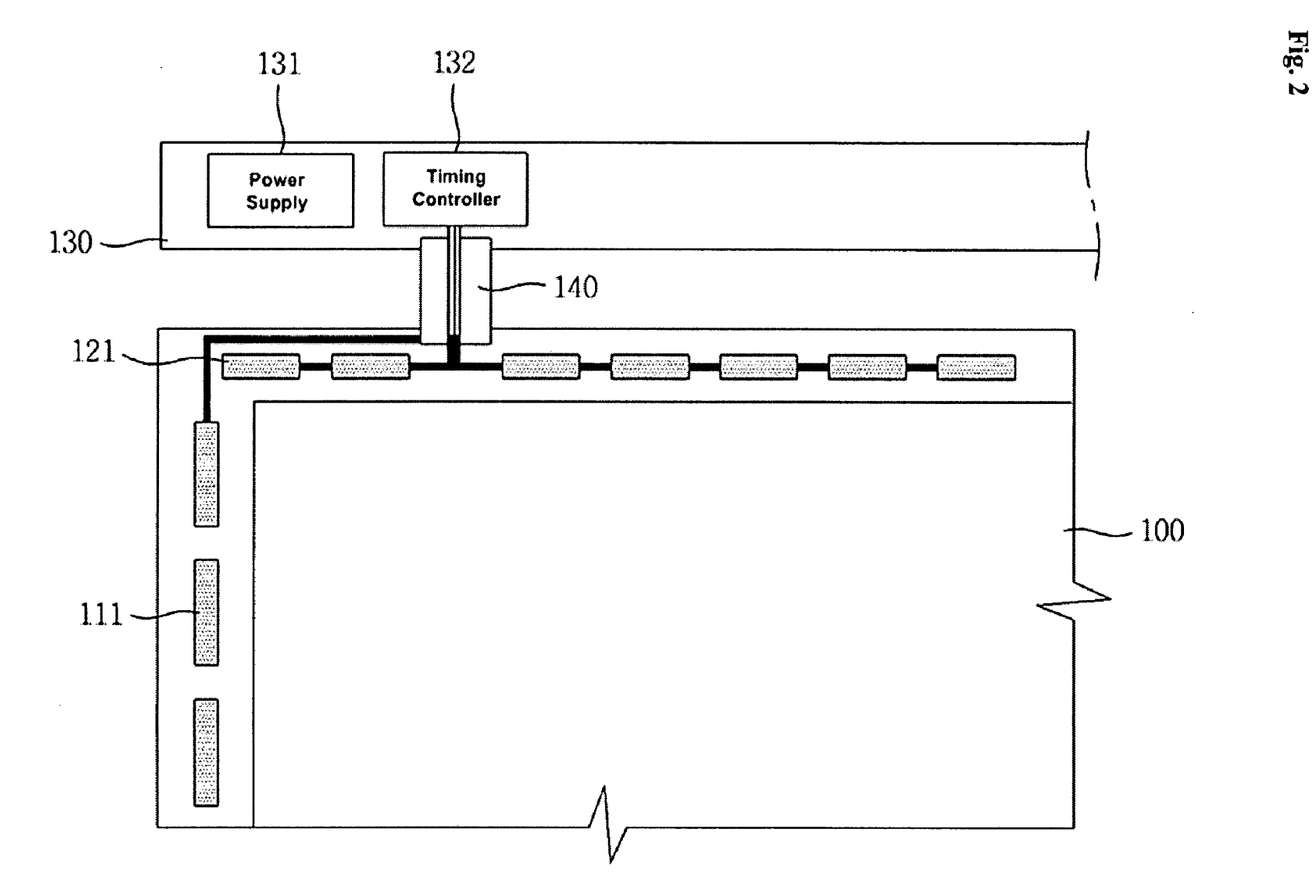

FIGS. 1 and 2 are schematic illustrations of a liquid crystal display according to the related art, wherein FIG. 1 shows a structure generally used for laptop computers and FIG. 2 shows a chip-on-glass (COG)-type cascade structure.

In the liquid crystal display having the structure shown FIG. 1, video data and control signals (gate control signal and data control signal) output from a timing controller 132 and driving voltages (reference power source) output from a power source 131 are all applied to each source driver 121 or each gate driver 111 via signal lines in a T-bone structure arranged on a printed circuit board (PCB) 130.

The timing controller 132 and power source 131 are chips that are mounted on the printed circuit board 130, and the gate drivers 111 and source drivers 121 are mounted on the tape carrier packages 110, 120, respectively, and connected to the liquid crystal panel 100.

The source drivers 121 are supplied with data control signals and video data from the timing controller 132 mounted on the printed circuit board 130 and driving voltages from the power source 131 through the tape carrier package 120, respectively, and the gate drivers 111 are supplied with gate control signals and driving voltages from the timing controller 132 and power source 131 through the tape carrier package 110.

This structure inevitably requires a printed circuit board 130 having a large area to apply signals to the source drivers 121 and gate drivers 111. Even when replaced by a chip-on-glass structure by bonding the source drivers 121 or gate drivers 111 to the exterior of the liquid crystal panel 100, a large area printed circuit board 130 will still be required.

On the other hand, in a liquid crystal display having the structure shown FIG. 2, the source drivers 121 and gate drivers 111 are mounted on the liquid crystal panel 100 using a chip-on-glass configuration. The source drivers 121 and gate drivers 111 are also supplied with control signals, video data, and driving voltages from the timing controller 132 and power source 131 on the printed circuit board 130 through a flexible print circuit (FPC) 140 and the line-on-glass (LOG)-type signal lines formed on the liquid crystal panel 100.

Because the gate drivers 111 receive relatively a small number of signals in comparison with the source drivers 121, it is also possible to arrange the signal lines on the liquid crystal panel using a line on glass configuration without providing a separate printed circuit board for supplying signals to the gate drivers 11.

In this structure, driving signals and control signals necessarily pass through the FPC board 140 so that they may be supplied to the gate drivers 111 and source drivers 121 bonded on the liquid crystal 100. This structure has the following problems.

First, the two-step process of chip-on-glass bonding and flexible printed circuit board manufacturing leads to the increase of the number of processes and requisite materials.

Second, the increase of the line-on-glass resistance, inner wiring resistance of the chip on glass, and bonding resistance causes the increase of output deviations and the image quality's deterioration.

Finally, the rise of material cost due to the application of the flexible printed circuit board is another problem with the two-step process.

SUMMARY OF THE INVENTION

Accordingly, the present invention is directed to a liquid crystal display and manufacturing method thereof that substantially obviates one or more of the problems due to limitations and disadvantages of the related art.

Accordingly, the present invention provides a liquid crystal display capable of unifying the bonding process to the manufacturing process without a great modification of the manufacturing process in a cascade structure, reducing the area required for the printed circuit board and the material cost by eliminating the necessity of the flexible printed circuit board, and improving image degradation by decreasing the wiring resistance.

An advantage of the present invention is to provide a method of a liquid crystal display capable of manufacturing efficiently the liquid crystal display.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal panel includes: a plurality of pixels defined by gate lines and data lines that cross each other, wherein a first group of signal lines is formed on the liquid crystal panel in an on-glass-configuration; a plurality of tape carrier packages mounted with source drivers that provide data signals through the data lines to the liquid crystal panel and mounted on the liquid crystal panel in a cascade structure, wherein a second group of signal lines connected to the first group of signal lines is formed thereon; and a printed circuit board combined directly with only one of the plurality of tape carrier packages so as to supply a plurality of driving signals and control signals to the liquid crystal panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrated embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings.

The above and/or other aspects and advantages of the present invention will become apparent and more readily appreciated from the following description of the exemplary embodiments, taken in conjunction with the accompanying drawings, wherein like reference numerals refer to like elements throughout.

Hereinafter, a liquid crystal display according to an embodiment of the present invention and a manufacturing method thereof will be described in more detail with reference to the accompanying drawings.

Figure 3:
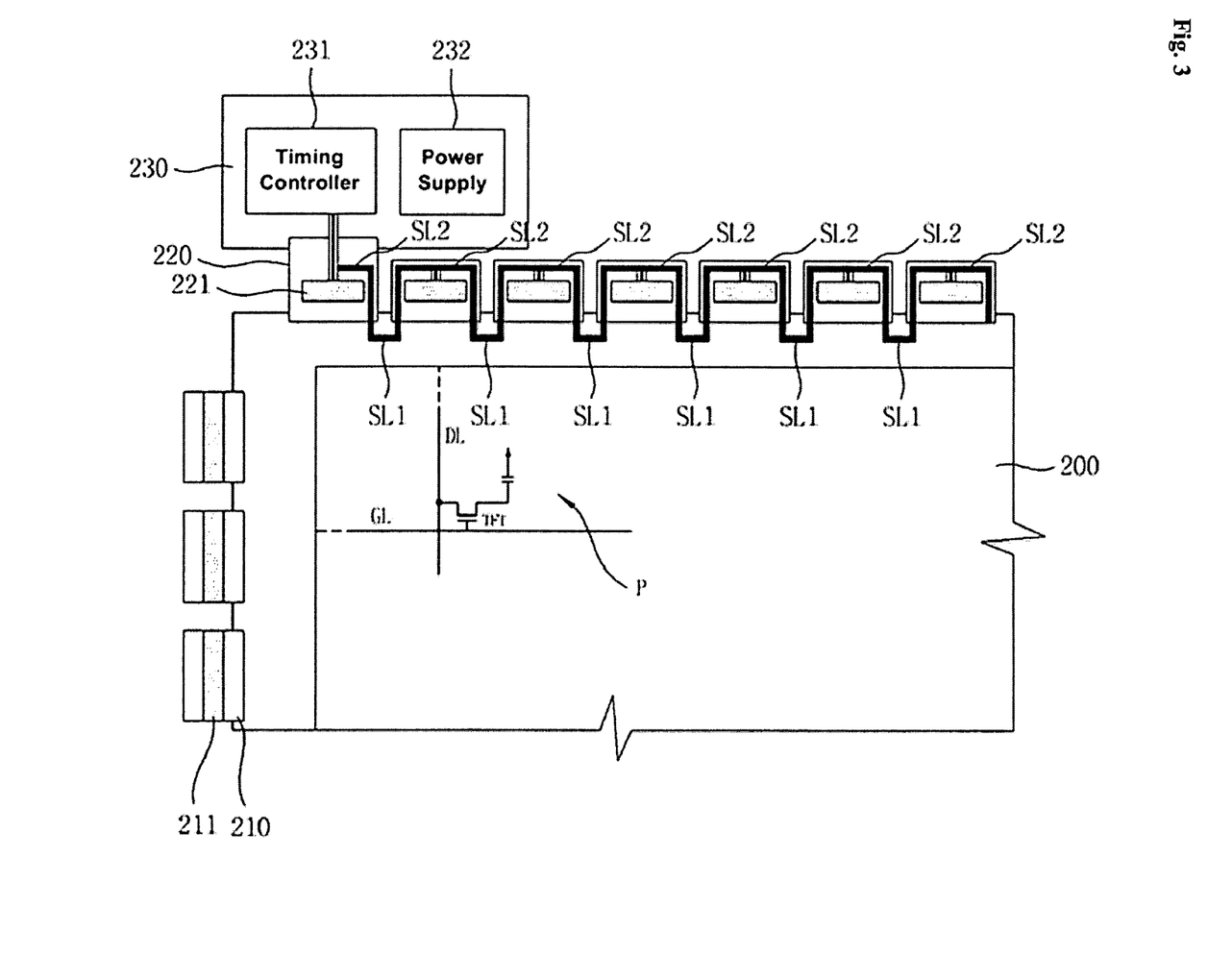
FIG. 3 is a schematic view of a liquid crystal display according to an embodiment of the present invention.

FIG. 3 is a schematic view of a liquid crystal display according to an embodiment of the present invention.

Referring to FIG. 3, a liquid crystal display according to an embodiment of the present invention includes a liquid crystal panel 200, a first tape carrier package 220 mounted with a first group of signal lines SL1 and source drivers 221, a second tape carrier package 210 mounted with gate drivers 211, and a printed circuit board 230.

The liquid crystal panel 200 includes pixels P defined by gate lines GL and data lines DL intersecting each other, with thin film transistors TFTs arranged on each pixel, and images are displayed by scan signals supplied through the gate lines GL and analog pixel voltages supplied through the data lines DL.

The first group of signal lines SL1 is formed directly on the exterior of the liquid crystal panel 200 as a line-on-glass type.

The gate drivers 211 sequentially supply scan signals to the gate lines, and FIG. 3 shows a case where the gate drivers 211 are mounted on the second tape carrier package 210 to combine with the liquid crystal panel 200.

The source drivers 221 are mounted on the first tape carrier package 220 with the second group of signal lines SL2 connected in cascade to the first group of signal lines SL1 to apply data control signals and driving voltages to the source drivers 221. The source drivers 221 convert video data into analog pixel voltages using gamma voltages if the video data is input from the timing controller 231 on the printed circuit board 230, and then supplies the converted analog pixel voltages to the data lines.

The printed circuit board 230 includes the timing controller 231 for supplying video data and gate control signals and data control signals for controlling the driving timing of the gate drivers 211 and source drivers 221, respectively, and a power source 232 for generating driving voltages (reference power source) for each component using an input power source.

The data control signals comprise source start pulses (SSPs), source shift clocks (SSCs), source output enable (SOC) signals, polarity (POL) signals, etc. and the gate control signals comprise gate start pulses (GSPs), gate shift clocks (GSCs), gate output enable (GOE) signals, etc.

The driving voltages include DC voltages such as gate high voltages (VGHs), gate low voltages (VGHs), common voltages (VCOMs), ground voltages (GNDs), and power source voltages (VCCs).

The printed circuit board 230 establishes a direct connection only with any one of the first tape carrier packages and may access the remaining first tape carrier packages through the connection, and this allows for minimizing the required area.

Figure 4:
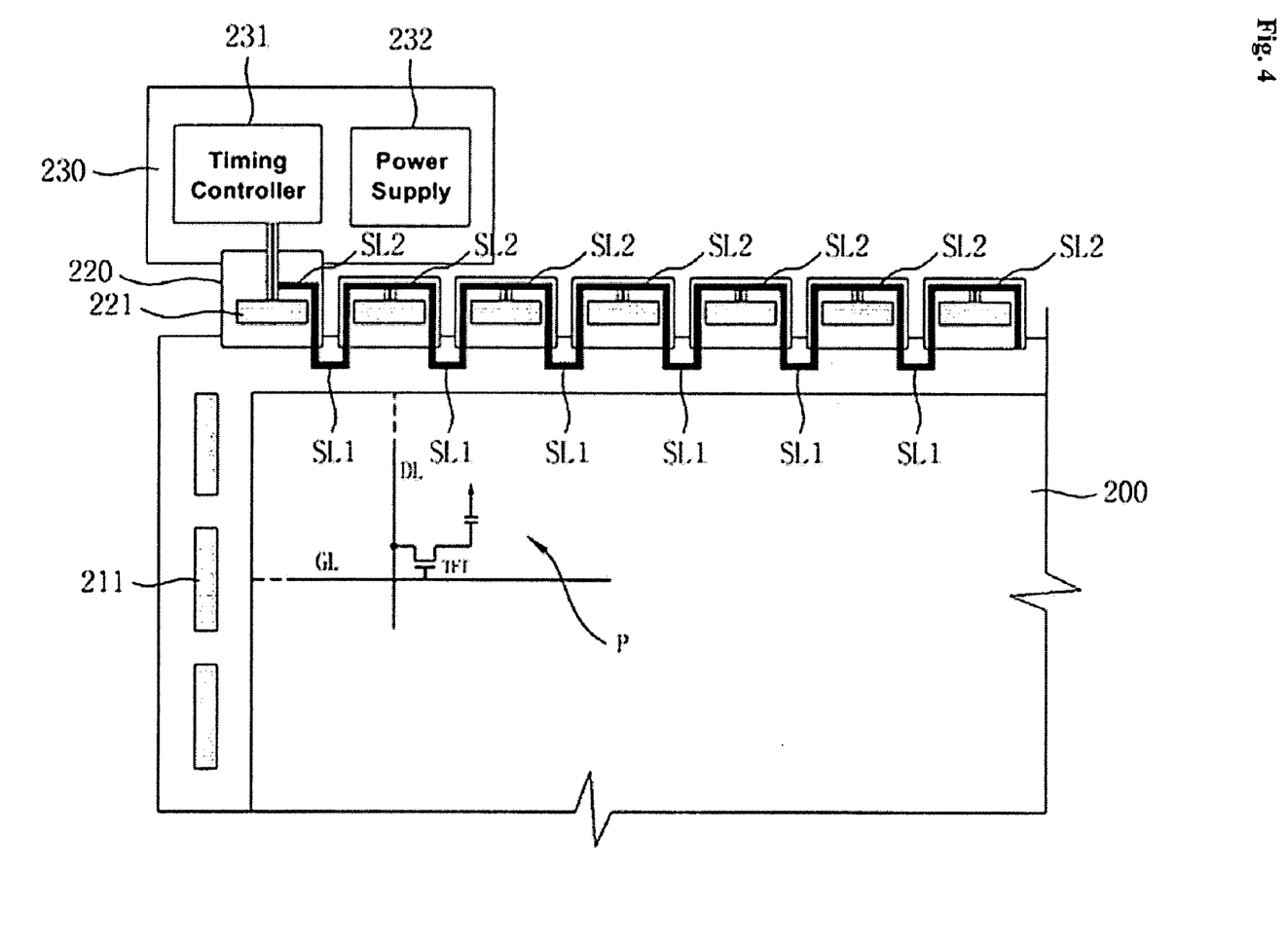
FIG. 4 is a schematic view of a liquid crystal display according to another embodiment of the present invention.

FIG. 4 is a schematic view of a liquid crystal display according to another embodiment of the present invention that shows a case where the gate drivers 211 are mounted directly on the exterior of the liquid crystal panel 200 in a chip on film configuration.

The use of a line-on-glass (LOG) structure and a chip-on-film (COF) structure to the source drivers 221, as shown in FIGS. 3 and 4, allows for the use of a cascade connection structure without a great modification of a working process.

Furthermore, it is possible to realize an additional embodiment that may reduce the price of the LCD by forming the gate driver circuits 211 directly on the transparent insulating substrate of the liquid crystal panel 200 without using the chip-type gate drivers 211 packaged by ICs.

In this case, on the transparent insulating substrate, a circuit is formed including elements such as a shift register, which serves as the gate driver 211, a level shifter, an output buffer.

More specifically, the shift register sequentially generates shift pulses in response to gate start pulses (GSPs) and gate shift clocks (GSCs) transmitted from the timing controller 231.

Then, the level shifter is supplied with the gate output enable (GOE) signals and generates scan signals corresponding to the shift pulses in the activated regions of the gate output enable (GOE) signals every one horizontal period to output the scan signals to the output buffer, which in turn supplies the scan signals from the level shifter sequentially to the gate lines to drive the gate lines sequentially.

Figure 5:
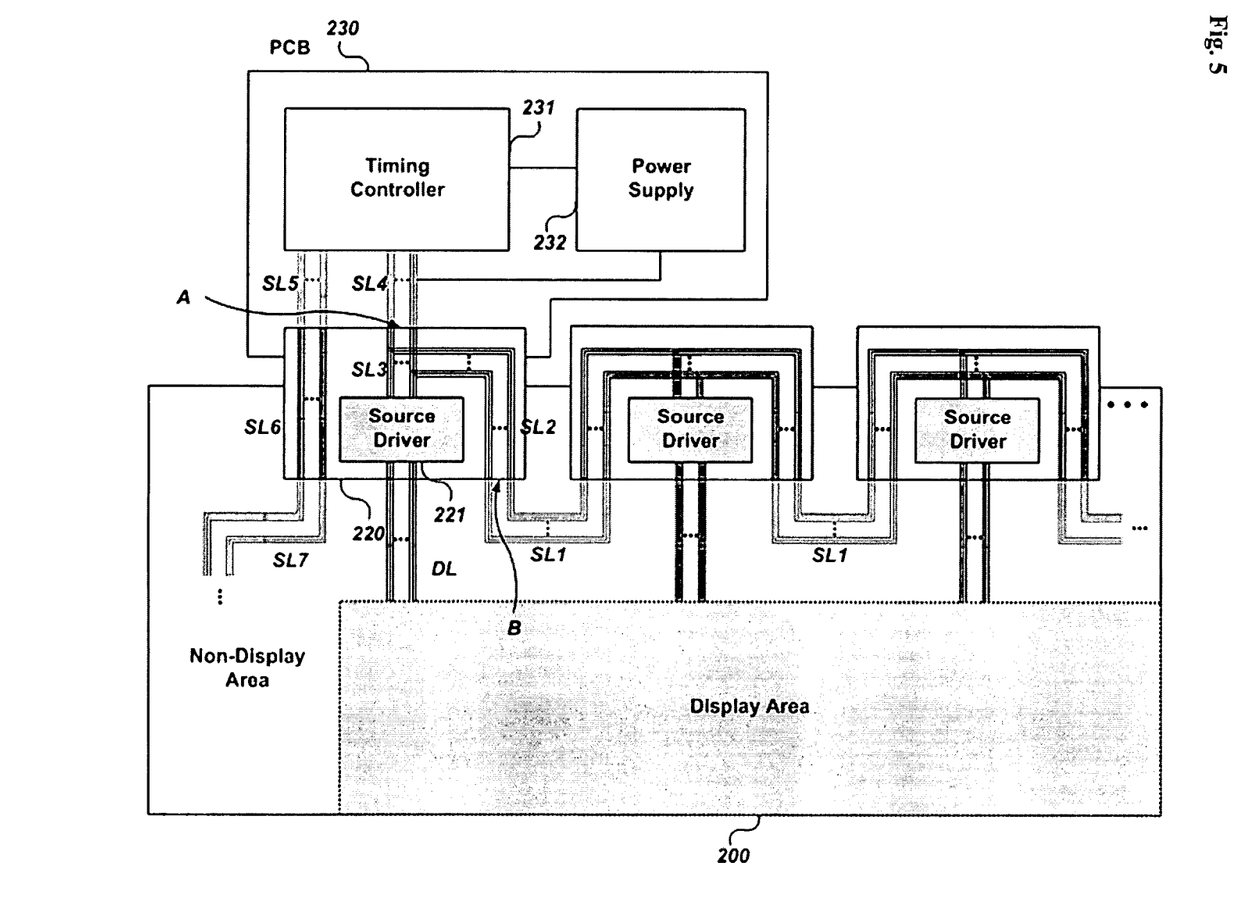
FIG. 5 is a detailed view of a liquid crystal display according to an embodiment of the present invention.

Meanwhile, FIG. 5 is a detailed view of a liquid crystal display according to an embodiment of the present invention.

Referring to FIG. 5 in a liquid crystal display according to an embodiment of the present invention, a liquid crystal panel 200 is divided into a display region including a pixel unit, a gate pad unit, and a data pad unit, and a non-display region mounted with a number of TCPs 220 and formed with a first group of signal lines SL1.

Accordingly, the first group of signal lines SL1 formed on the exterior of the liquid crystal panel 200 is connected to a second group of signal lines SL2 formed on the TCP 220 Each source driver 221 is mounted on each TCP 220, and a second group of signal lines SL2 is connected to the first group of signal lines SL1. A third group of signal lines SL3 is connected to a fourth group of signal lines SL4 provided from the timing control unit 231 of the PCB 230. Also, the second group of signal lines SL2 may be split from the third group of signal lines SL3.

The first group of signal lines SL1 and the second group of signal lines SL2 formed in the cascade type may be connected to the plurality of TCPs 220.

Here, the reference letter A indicates a portion where the PCB 230 and TCP 220 are connected to each other, and the reference letter B indicates a portion where the TCP 220 and the first group of signal lines on the liquid crystal panel 200 are connected to each other.

On the other hand, in a case where the gate drivers are mounted on a COG-type glass substrate, i.e. the liquid crystal panel 200, the gate signal and power source lines may be applied from the timing control unit 231 through the TCP 220 to the gate drivers. For example, the gate signals may be output from the timing control unit 231 through the fifth group of signal lines SL5 and connected via the sixth group of signal lines SL6 on the TCP 220 to the LOG-type seventh group of signal lines SL7. As a result, these gate signals are electrically connected to the gate drivers, respectively.

Figure 6:
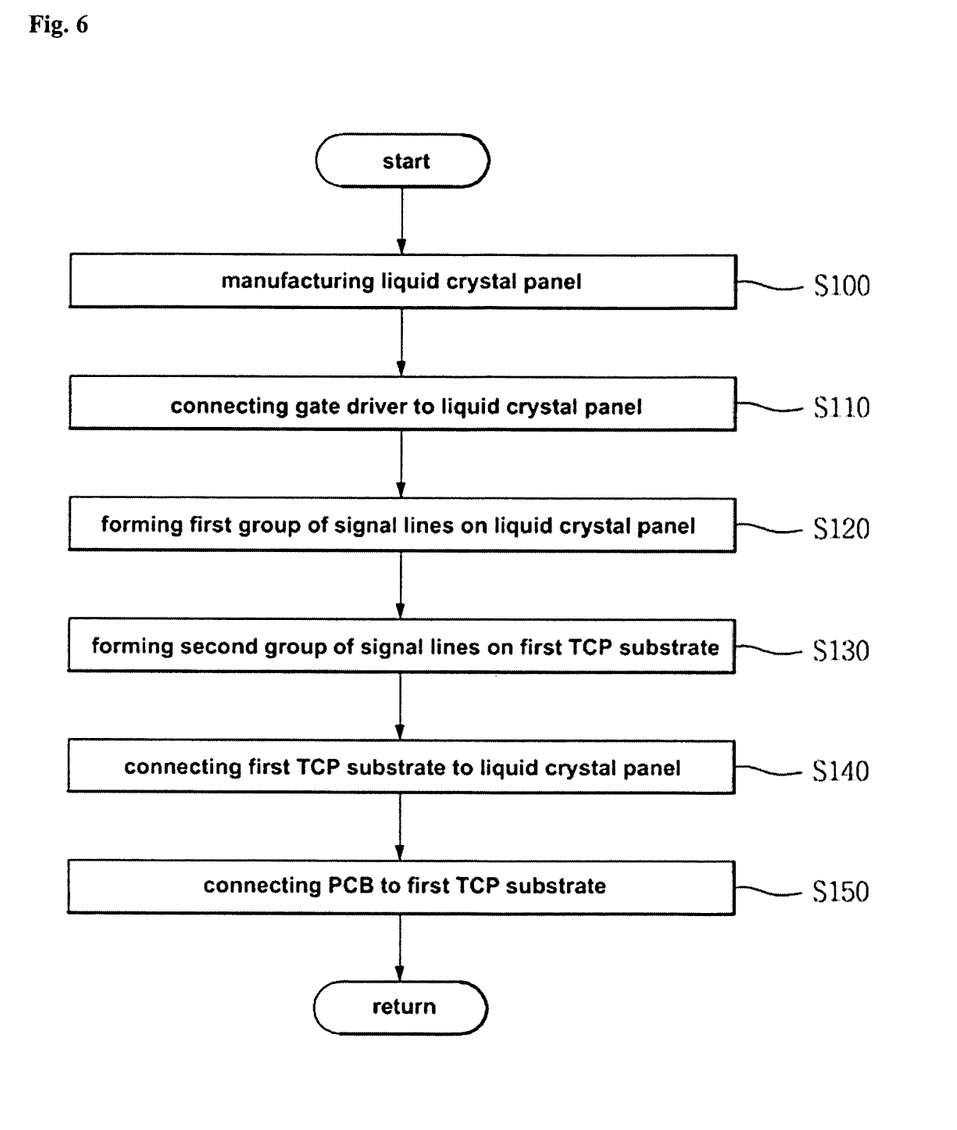
FIG. 6 is a flowchart of illustrating a manufacturing method of a liquid crystal display according to an embodiment of the present invention.

FIG. 6 is a flowchart illustrating a manufacturing method of a liquid crystal display according to an embodiment of the present invention.

First a liquid crystal panel 200 including pixels defined by gate lines and data lines crossing each other with thin film transistors arranged at the crossing of the gate lines and data lines is manufactured in step S100. The liquid crystal panel 200 displays images using the pixels according to scan signals supplied through the gate lines and analog pixel voltages supplied through the data lines.

Next, in step S10, a line-on-glass-type first group of signal lines SL1 arranged directly on the exterior of the liquid crystal panel 200 is formed.

Then, the gate drivers 211 that supply scan signals sequentially to the gate lines are combined with the liquid crystal panel 200 in step S120. Here, the gate drivers 211 may be combined with the liquid crystal panel 200 while mounted on the second tape carrier packages 210 or mounted directly on the exterior of the liquid crystal panel in a chip-on-film configuration.

Next, source drivers 221 are mounted that supplies data lines the analog pixel voltages corresponding to the video data if video data are inputted to the first tape carrier packages 220. A second group of signal lines SL2 is formed that applies the data control signals and driving voltages to the source drivers 221 in step S130.

Then, the first tape carrier packages 220 are combined with the liquid crystal panel 200 in step S140 so that the second group of signal lines SL2 may be connected in cascade to the first group of signal lines SL1.

Next, the printed circuit board 230 for supplying gate control signals and data control signals for controlling the gate drivers 211 and source drivers 221, respectively, video data, and driving voltages is connected to the first tape carrier packages 220 in step S150.

Here, the printed circuit board 230 is connected directly to only any one of the first tape carrier packages 220 to minimize its area, and it is possible to transmit the data control signals and driving voltages to all the first tape carrier packages 220 through the first tape carrier package 220 connected directly to the printed circuit board 230 and the first and second signals lines SL1, SL2 connected in cascade to each other.

It is to be understood by those skilled in the art that the invention may be embodied in several forms without departing from the spirit of essential characteristics thereof.

Therefore, it is understood by those skilled in the art that the present embodiments are therefore illustrative and not restrictive.

As mentioned above, a liquid crystal display according to an embodiment of the present invention may unify the bonding process to the manufacturing process without a great modification of the manufacturing process in a cascade structure, reducing the area required for the printed circuit board and the material cost by eliminating the necessity of the flexible printed circuit board, and improving image degradation by decreasing the wiring resistance.

In addition, a manufacturing method of a liquid crystal device according to an embodiment of the present invention may manufacture the liquid crystal panel efficiently.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device comprising:
    a liquid crystal panel comprising a plurality of pixels defined by gate lines and data lines intersecting each other and formed with an on-glass-type first group of signal lines;
    a plurality of tape carrier packages mounted with source drivers for providing data signals through the data lines to the liquid crystal panel, formed with a second group of signal lines connected to the first group of signal lines, respectively, formed with a third group of signal lines electrically connected directly to the second group of signal lines and the source drivers, respectively, and mounted on the liquid crystal panel in a cascade structure; and
    a printed circuit board combined directly with only one of the plurality of tape carrier packages, and having data signal lines for supplying data control signals and data signals for the source drivers and gate signal lines for supplying gate control signals for gate drivers, respectively,
    wherein the data signal lines of the printed circuit board are directly to the third group of signal lines connected with the source driver in the only one of the plurality of tape carrier packages so that the data control signals and data signals are supplied to the source driver via a direct connection,
    wherein the only one tape carrier package has a fourth group of signal lines electrically connected to the gate signal lines of the printed circuit board,
    wherein the liquid crystal panel has a fifth group of signal lines electrically connected to the fourth group of signal lines so that the gate signal lines formed in the printed circuit board are connected with the fifth group of signal lines via the fourth group of signal lines.

2. The liquid crystal device as claimed in claim 1, wherein the printed circuit board is connected in cascade to all the tape carrier packages through the directly combined tape carrier package.

3. The liquid crystal device as claimed in claim 1, further comprising:

a plurality of second tape carrier packages mounted with the gate driver.

4. The liquid crystal device as claimed in claim 1, wherein the gate drivers are mounted on the exterior of the liquid crystal panel in a chip-on-film type.

\* \* \* \* \*